(12) United States Patent
Kim et al.

(10) Patent No.: US 8,546,218 B2
(45) Date of Patent: Oct. 1, 2013

(54) METHOD FOR FABRICATING SEMICONDUCTOR DEVICE WITH BURIED WORD LINE

(75) Inventors: Uk Kim, Gyeonggi-do (KR); Kyung-Bo Ko, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 209 days.

(21) Appl. No.: 13/102,869

(22) Filed: May 6, 2011

(65) Prior Publication Data

US 2012/0156868 A1    Jun. 21, 2012

(30) Foreign Application Priority Data

Dec. 17, 2010   (KR) .................. 10-2010-0130286

(51) Int. Cl.
*H01L 21/336* (2006.01)
(52) U.S. Cl.
USPC ........... 438/268; 438/156; 438/262; 438/424; 438/427; 438/435; 438/666; 438/674; 438/696; 438/700; 438/702; 438/703; 438/704; 438/735; 438/736; 438/761
(58) Field of Classification Search
USPC .................. 438/156, 262, 268, 424, 427, 435, 438/666, 674, 696, 700, 702–704, 735–736, 438/761
See application file for complete search history.

(56) References Cited

U.S. PATENT DOCUMENTS

| | | | |
|---|---|---|---|
| 2008/0150012 A1* | 6/2008 | Thies et al. | 257/329 |
| 2010/0120221 A1* | 5/2010 | Kang | 438/430 |
| 2011/0298046 A1* | 12/2011 | Hong | 257/331 |
| 2011/0304028 A1* | 12/2011 | Kim | 257/623 |
| 2012/0039104 A1* | 2/2012 | Lin et al. | 365/63 |

FOREIGN PATENT DOCUMENTS

| | | |
|---|---|---|
| KR | 1020090068762 | 6/2009 |
| KR | 1020090106152 | 10/2009 |
| KR | 1020090106153 | 10/2009 |

OTHER PUBLICATIONS

Notice of Allowance issued by the Korean Intellectual Property Office on Nov. 30, 2011.

* cited by examiner

*Primary Examiner* — Bac Au
(74) *Attorney, Agent, or Firm* — IP & T Group LLP

(57) ABSTRACT

A method for fabricating a semiconductor device includes etching a substrate to form a plurality of bodies isolated by a first trench, forming a buried bit line gap-filling a portion of the first trench, etching the top portions of the bodies to form a plurality of pillars isolated by a plurality of second trenches extending across the first trench, forming a passivation layer gap-filling a portion of the second trenches, forming an isolation layer that divides each of the second trenches into isolation trenches over the passivation layer, and filling a portion of the isolation trenches to form a buried word line extending in a direction crossing over the buried bit line.

19 Claims, 15 Drawing Sheets

A-A'

METHOD FOR FABRICATING SEMICONDUCTOR DEVICE WITH BURIED WORD LINE

CROSS-REFERENCE TO RELATED APPLICATIONS

The present application claims priority of Korean Patent Application No. 10-2010-0130286, filed on Dec. 17, 2010, which is incorporated herein by reference in its entirety.

BACKGROUND

1. Field

Exemplary embodiments of the present invention relate to a method for fabricating a semiconductor device, and more particularly, to a method for fabricating a semiconductor device with a buried word line.

2. Description of the Related Art

Pattern shrinkage may result in yield improvement. Pattern shrinkage requires a mask process that can create a smaller sized mask. In particular, ArF photoresist (PR) layers are used in semiconductor devices of not more than 40 nm. However, as the patterns are becoming finer, the ArF photoresist layers are reaching their size limitations.

Therefore, there is a demand for a new patterning technology for memory devices, such as a Dynamic Random Access Memory (DRAM), and a three-dimensional (3D) cell forming technology.

Metal Oxide Semiconductor Field Effect Transistor (MOSFET) devices with planar channels are reaching the physical limits imposed by the short channel effect, the on current, and the leakage current, thus making it difficult to further reduce the size of devices. In order to solve this problem, extensive research is being conducted on vertical-channel transistors.

A vertical-channel transistor has a channel formed in a vertical direction by forming a pillar-type active region extending vertically on a substrate, forming a gate electrode (hereinafter referred to as a vertical gate (VG)) on the sidewall of the active region, and forming junction regions such as a source region and a drain region on and under the active region with respect to the vertical gate. A buried bit line (BBL) is connected to a junction region of the vertical-channel transistor, and a storage node is connected to another junction region of the vertical-channel transistor.

FIGS. 1A to 1C are cross-sectional views illustrating a known semiconductor device. FIG. 1B is a cross-sectional view taken along a line B-B' of FIG. 1A. FIG. 1C is a cross-sectional view taken along a line A-A' of FIG. 1A.

Referring to FIGS. 1A to 1C, a plurality of active regions isolated by a first trench 12 are formed on a substrate 11. Each active region includes a body 13A and a pillar 13B. Each pillar 13B is formed over a respective body 13A. A hard mask layer 14 is formed on the pillar 13B. A junction 17 is formed on a portion of one sidewall of the body 13A. The first trench 12 is filled with a buried bit line 18 that is electrically connected to the junction 17. First and second liner layers 15 and 16 are formed on the sidewalls of the body 13A and the pillar 13B and the surface of the first trench 12. A word line 22 extending across the buried bit line 18 is formed on the sidewall of the pillar 13B. The pillars 13B are isolated by a second trench 23. A gate dielectric 20 is formed between the word line 22 and the pillar 13B. The word line 22 also serves as a vertical gate (VG).

In the above described technology, an etch-back process is performed to form the buried bit line 18 (hereinafter referred to as a BBL etch-back process). Also, an etching process is performed to form the word line 22 (hereinafter referred to as a VG etching process).

The BBL etch-back process and the VG etching process have no etch end point in terms of structure, and have a very large process variation. Therefore, a process variation of the two etching processes must be considered to prevent an electrical short between the buried bit line 18 and the word line 22.

For example, it is difficult to maintain the residual thickness R of an interlayer dielectric 19 as a result of the VG etching process. That is, it is difficult to control the depth of the second trench 23 created to isolate the word lines 22.

Also, the surface morphology of the buried bit line 18 is not uniform in the BBL etch-back process. Therefore, it is difficult to secure the uniformity of the word line 22 in a subsequent process.

Also, using a spacer 21 as an etch barrier, a VG etching process is performed to form the word line 22. However, it is difficult to selectively etch the hard mask layer 14 and the spacer 21 in the VG etching process. Therefore, the loss 24 of the body 13A is difficult to control, thus degrading the uniformity of the VG etching process.

SUMMARY

Exemplary embodiments of the present invention are directed to a method for fabricating a semiconductor device, which can facilitate the isolation between a buried bit line and a buried world line, can secure the uniformity of a word line, and can improve the uniformity of an etching process.

In accordance with an exemplary embodiment of the present invention, a method for fabricating a semiconductor device includes etching a substrate to form a plurality of bodies isolated by a first trench, forming a buried bit line gap-filling a portion of the first trench, etching the top portions of the bodies to form a plurality of pillars isolated by a plurality of second trenches extending across the first trench, forming a passivation layer gap-filling a portion of the second trenches, forming an isolation layer that divides each of the second trenches into isolation trenches over the passivation layer, and filling a portion of the isolation trenches to form a buried word line extending in a direction crossing over the buried bit line. The forming of the passivation layer may include forming a dielectric layer to gap-fill the second trenches, and etching back the dielectric layer. The passivation layer may include an oxide layer. The forming of the isolation layer may include forming spacers along both sidewalls of the second trenches over the passivation layer, forming a dielectric layer gap-filling the second trenches having the spacers formed therein, and selectively removing the spacers to form the isolation trenches. The isolation layer may include an oxide layer.

In accordance with another exemplary embodiment of the present invention, a method for fabricating a semiconductor device includes etching a substrate to form a plurality of pillars isolated by a trench, forming a passivation layer gap-filling a portion of the trench, forming spacers covering both sidewalls of the trench over the passivation layer, forming an isolation layer gap-filling the trench between the spacers, selectively removing the spacers to form isolation trenches, and forming a buried word line filling the isolation trenches.

DETAILED DESCRIPTION

Figure 1A:
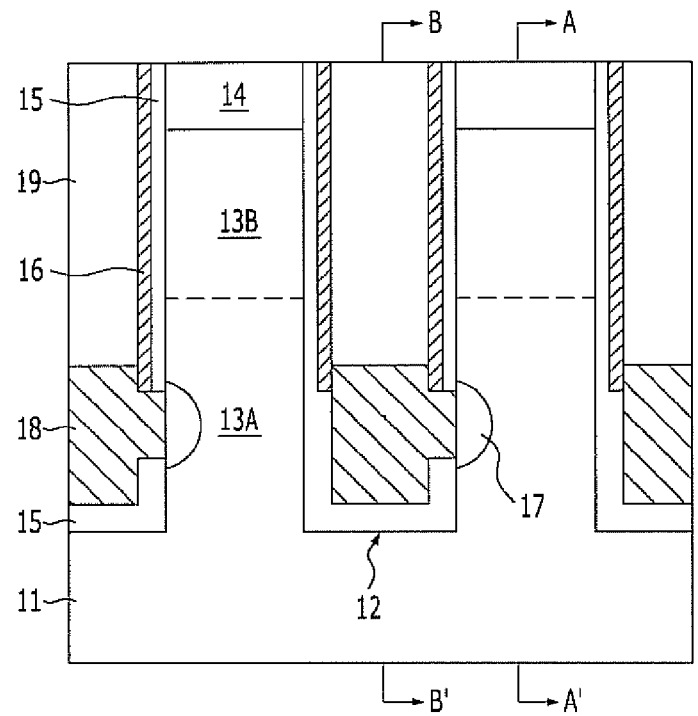
FIG. 1A is a cross-sectional view illustrating a known semiconductor device.
Figure 1B:
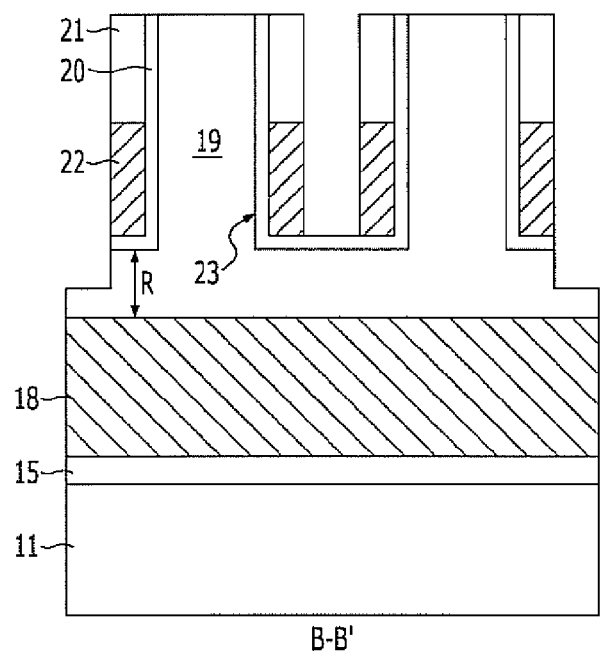
FIG. 1B is a cross-sectional view taken along a line A-A' of FIG. 1A.
Figure 1C:
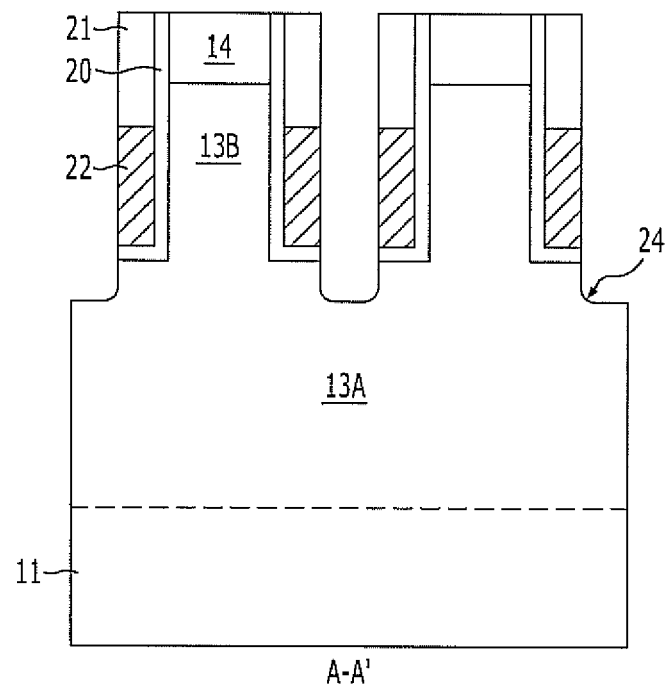
FIG. 1C is a cross-sectional view taken along a line B-B' of FIG. 1A.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

FIGS. 2A to 2I are cross-sectional views illustrating a method for fabricating a semiconductor device in accordance with an exemplary embodiment of the present invention.

Figure 2A:
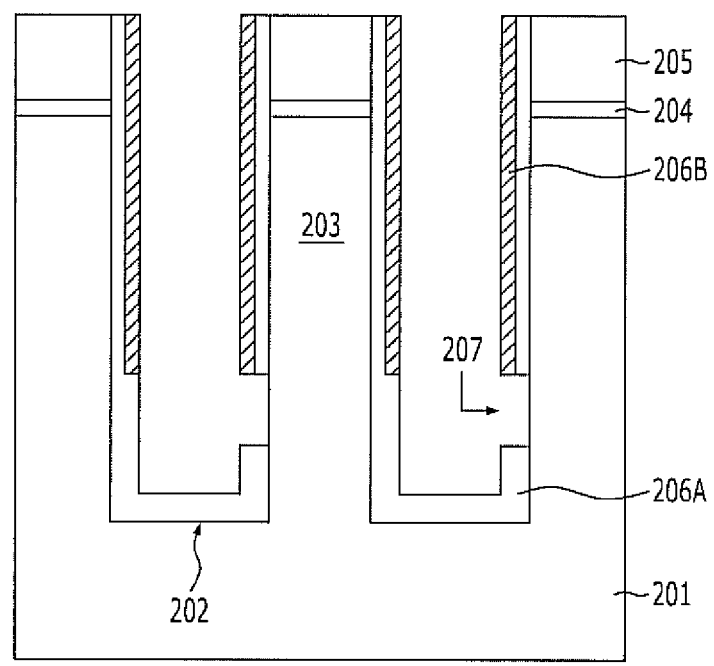
FIGS. 2A to 2I are cross-sectional views illustrating a method for fabricating a semiconductor device in accordance with an exemplary embodiment of the present invention.

Referring to FIG. 2A, a plurality of bodies 203 isolated by a first trench 202 are formed on a substrate 201. The substrate 201 includes a silicon substrate. The substrate 201 is etched to a certain depth to form the first trench 202. The body 203 is formed by the first trench 202. Where the substrate 201 includes a silicon substrate, the body 203 is a silicon body. The body 203 extends vertically from the surface of the substrate 201. The body 203 is used as an active region. As is well known in the art, the active region is a region where the channel, source, and drain of a transistor are formed. The body 203 has a plurality of sidewalls. The body 203 may be a line-type body having at least two opposite sidewalls. The body 203 is also called an active body.

A hard mask layer 205 is formed on the body 203. The hard mask layer 205 serves as an etch barrier when etching the substrate 201 to form the first trench 202. The hard mask layer 205 includes a dielectric material, such as an oxide layer or a nitride layer. In an exemplary embodiment, the hard mask layer 205 may include a silicon nitride layer. A pad layer 204 is formed under the hard mask layer 205. The pad layer 204 may include an oxide layer such as a silicon oxide layer.

A dielectric layer is formed on both sidewalls of the body 203, the surface of the first trench 202 between the bodies 203, and the sidewalls of the hard mask layer 205. The dielectric layer includes a liner oxide layer 206A and a liner nitride layer 206B. The liner oxide layer 206A is formed on both sidewalls of the body 203 and the surface of the substrate 201. The liner nitride layer 206B is formed on a portion of the surface of the liner oxide layer 206A.

A portion of the dielectric layer is removed to form a side contact 207. The side contact 207 has a One-Side-Contact (OSC) structure that selectively exposes a portion of one sidewall of the body 203. The side contact 207 is a line-type contact. That is, the side contact 207 extends to form a line shaped opening along the horizontal direction of the body 203 to expose a portion of the sidewall of the body.

As described above, the side contact 207 exposing a portion of the sidewall of the body 203 is formed by the dielectric layer. A method for forming the side contact 207 will be described below in more detail with reference to FIGS. 3A to 3K.

Figure 2B:
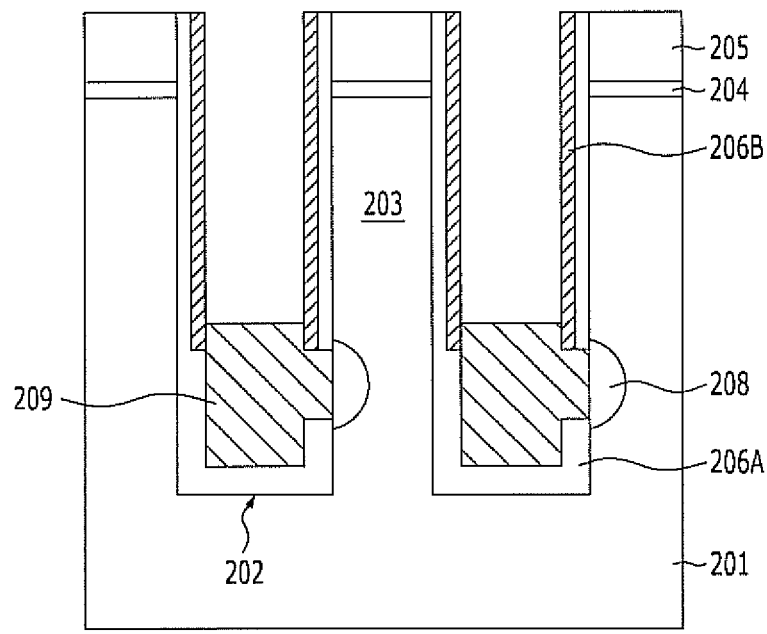

Referring to FIG. 2B, a junction 208 is formed on a portion of the sidewall of the body 203 exposed by the side contact 207. The junction 208 may be formed using a tilt ion implantation process, a plasma doping process, or a thermal diffusion process using a doped layer. The junction 208 has a doping concentration of approximately $1 \times 10^{20}$ atoms/cm$^3$ or more. The junction 208 is doped with phosphorus (P) or arsenic (As). Accordingly, the junction 208 is an N-type junction.

The use of a plasma doping process or a thermal diffusion process can control the depth of the junction 208 to be small, and can facilitate control over the doping concentration. The junction 208 serves as the source or drain of a vertical-channel transistor.

A buried bit line 209 is formed to be connected to the junction 208 and fill a portion of the first trench 202. The buried bit line 209 may be formed by gap-filling a conductive layer and planarizing the resulting structure through a Chemical Mechanical Polishing (CMP) process. The conductive layer may also be etched back to a desired height with regards to the location of the junction 208. Accordingly, the buried bit line 209 is formed to be buried in the first trench 202 and connected to the junction 208. The buried bit line 209 may be formed using a metal layer, such as a titanium (Ti) layer or a tungsten (W) layer. In an exemplary embodiment, the buried bit line 209 is formed using a tungsten layer. The buried bit line 209 is formed of a metal layer to reduce resistance. Accordingly, a device without operation characteristic degradation can be implemented even when the size of the semiconductor device is reduced.

In another exemplary embodiment, a barrier metal layer may be formed before the forming of the buried bit line 209. The barrier metal layer may be formed by stacking a titanium (Ti) layer and a titanium nitride (TiN) layer.

Figure 2C:
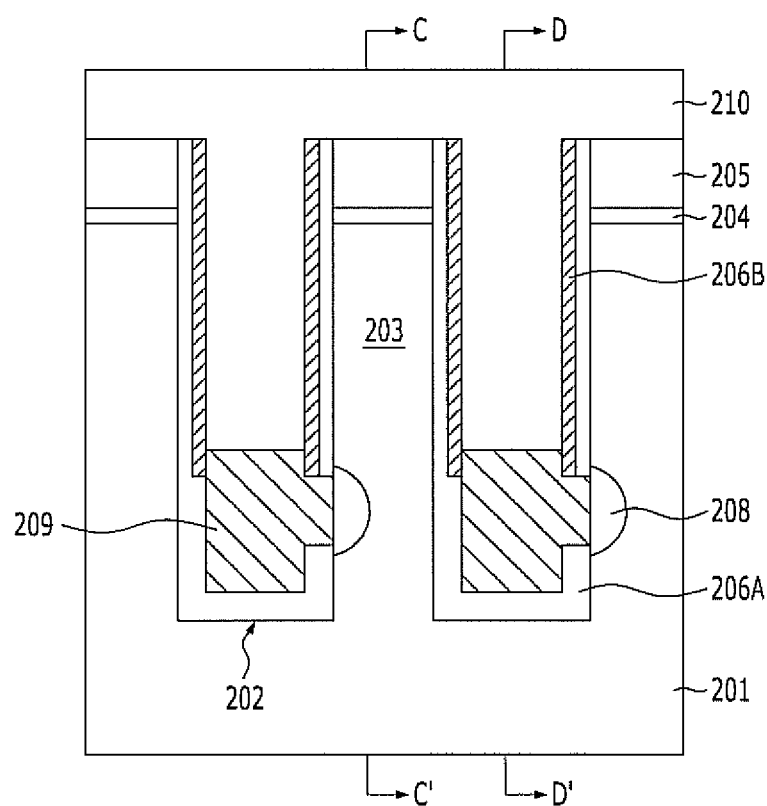

Referring to FIG. 2C, a first interlayer dielectric 210 is formed on the entire surface including the buried bit line 209. The first interlayer dielectric 210 includes an oxide layer such as a silicon oxide layer. The first interlayer dielectric 210 may include a Spin On Dielectric (SOD) layer or a High density Plasma Oxide (HDP) layer. Herein, the HDP layer may be formed after the gap-filling of the SOD layer. Hereinafter, the first interlayer dielectric 210 may be referred to as an HDP layer.

The first interlayer dielectric 210 gap-fills the first trench 202 over the buried bit line 209 and between the bodies 203.

Hereinafter, for the convenience of description, the fabrication processes will be described with reference to cross-sectional views taken along a line C-C and a line D-D' of FIG. 2C.

Figure 2D:
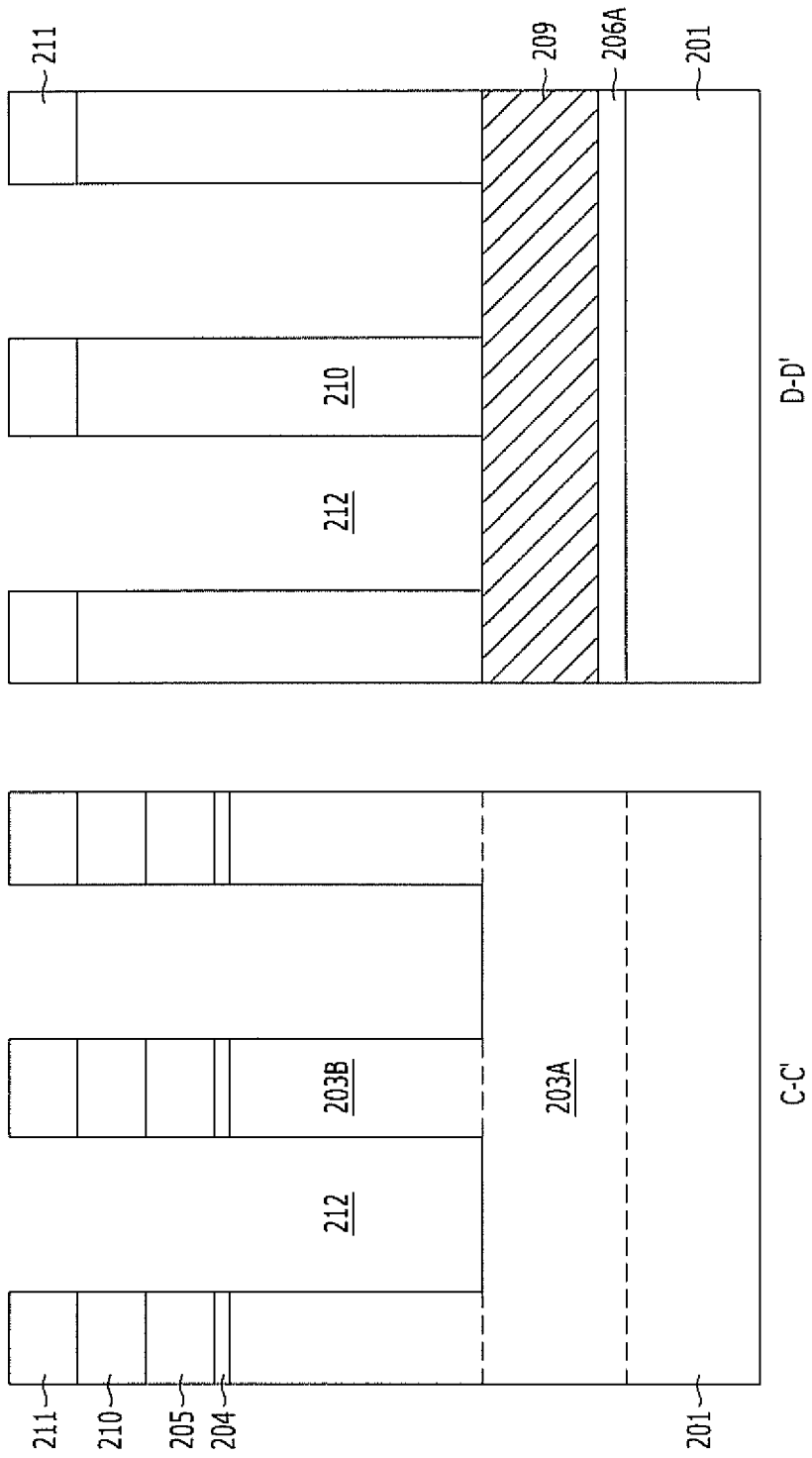

Referring to FIG. 2D, a word line trench mask 211 is formed on the first interlayer dielectric 210. The word line trench mask 211 is formed using a photoresist layer. More specifically, the word line trench mask 211 is formed by patterning the photoresist layer to create line shaped patterns that are separated by a space and extend in a direction that crosses over the buried bit line 209.

The first interlayer dielectric 210 is etched using the word line trench mask 211 as an etch barrier. At this point, the hard mask layer 205, the pad layer 204 and the body 203 are also etched simultaneously. By etching the body 203, an active body 203A and an active pillar 203B are formed. The active body 203A is formed on the substrate 201, and the active pillar 203B is formed over the active body 203A. In many cases, a plurality of active pillars 203B are formed on one active body 203A, as a result etching the body 203. The active body 203A is a portion where the junction 208 is formed, and has a line shape that extends in the same direction as the buried bit line 209. The active pillar 203B extends vertically on the body 203A. A plurality of active pillars 203B, formed on one active body 203A, are isolated by a second trench 212. The second trench 212 is formed across the first trench 202 and the buried bit line 209. Herein, the process of forming the second trench 212, the active body 203A, and the active pillar 203B is called a vertical gate (VG) etching process.

The present invention does not consider the residual thickness of the first interlayer dielectric 210 in the VG etching process. That is, the first interlayer dielectric 210 is etched to expose the surface of the buried bit line 209. For example, the VG etching process uses a gas mixture of HBr and $O_2$ to etch the body 203, and uses a gas mixture of $CF_4$ and He to etch the first interlayer dielectric 210.

Figure 2E:
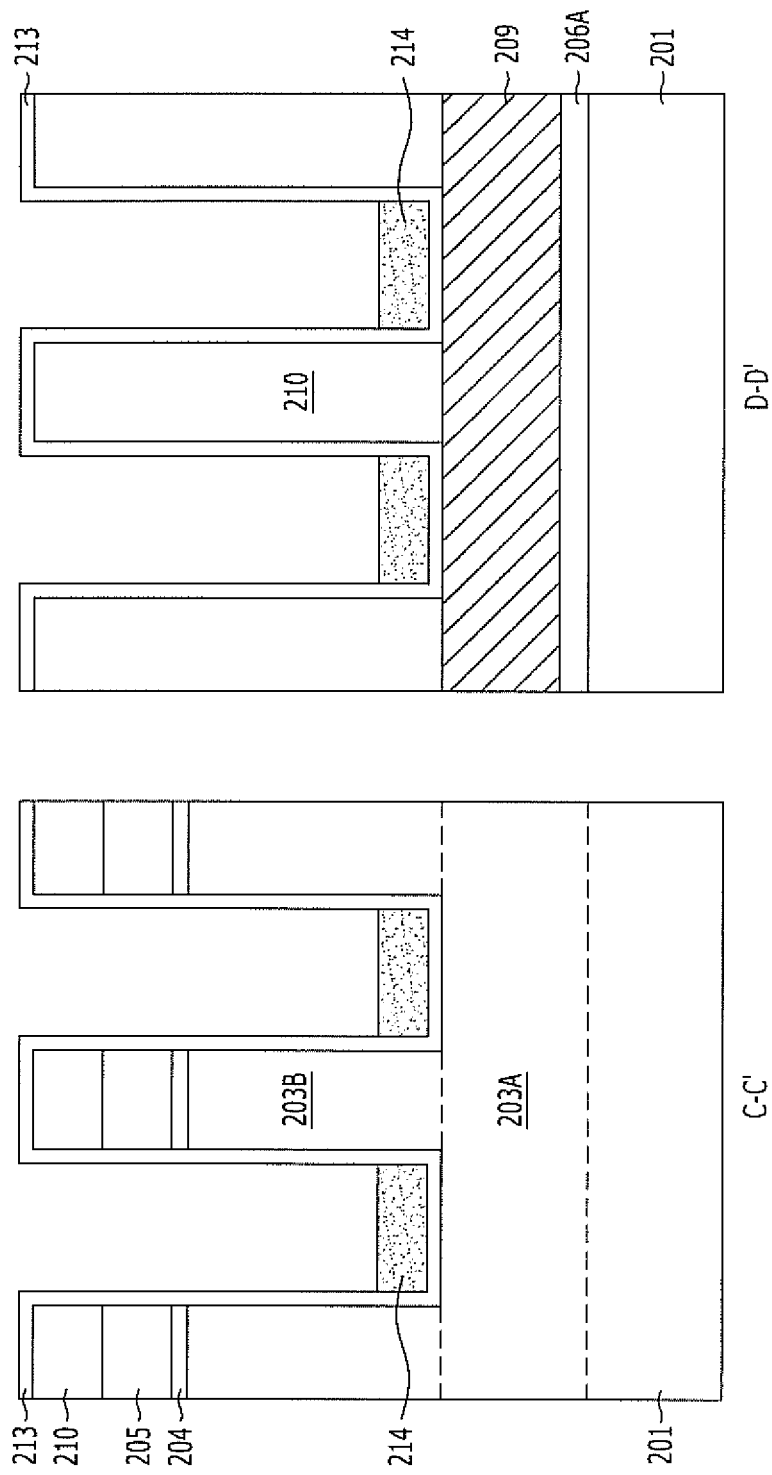

Referring to FIG. 2E, the word line trench mask 211 is removed.

After the word line trench mask 211 is removed, a gate insulating layer 213 is formed. A second interlayer dielectric 214 is formed on the gate insulating layer 213 to gap-fill the second trench 212. A CMP-based planarization process and an etch-back process are sequentially performed to manipulate the second interlayer dielectric 214 to a height that partially gap-fills the second trench 212. Hereinafter, the second interlayer dielectric 214 will be referred to as a passivation layer 214.

Figure 2F:
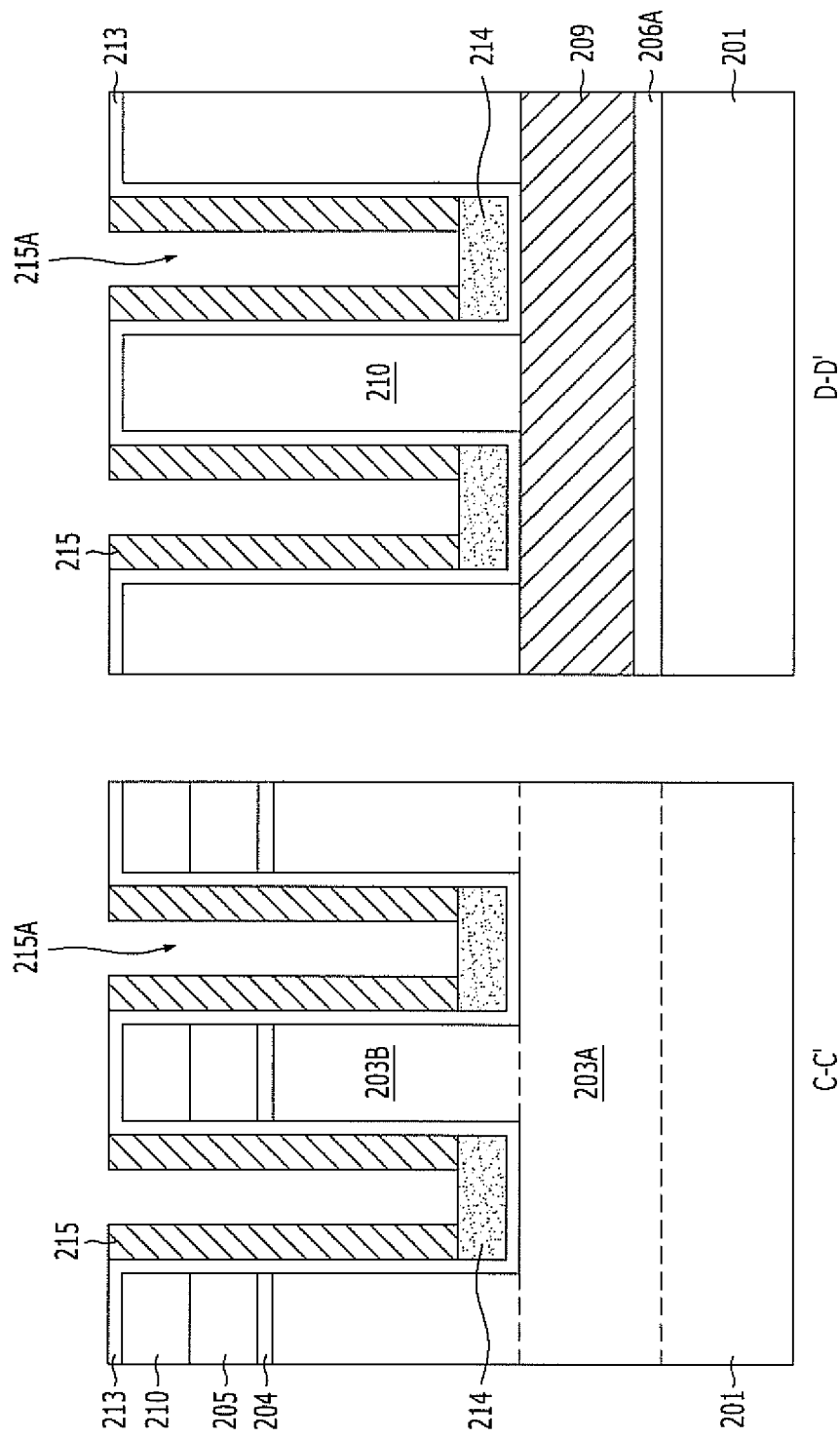

Referring to FIG. 2F, a spacer layer is formed on the entire surface including the passivation layer 214. The spacer layer may include a nitride layer such as a silicon nitride layer. The spacer layer may be deposited through a low-temperature Chemical Vapor Deposition (CVD) process (normal temperature ~400° C.) or an Atomic Layer Deposition (ALD) process. The use of the low-temperature CVD or ALD process provides good step coverage. A spacer etching process, for example, an etch-back process is performed onto the spacer layer to form spacers 215. The spacer etching process is performed through an etch-back process to prevent an interference between the buried word lines. The etch-back process may be performed using fluoride gas or oxygen gas.

Figure 2G:
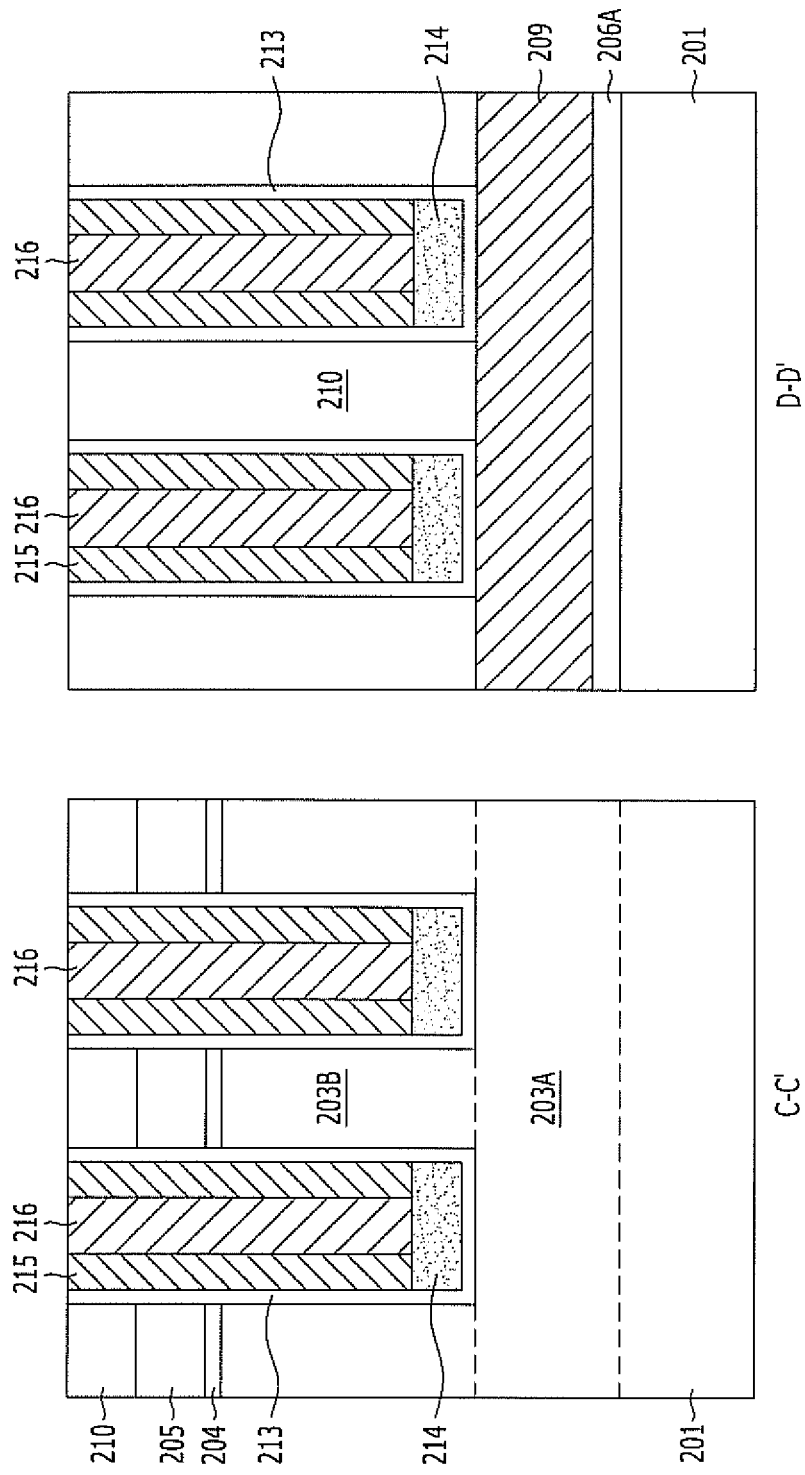

Referring to FIG. 2G, a third interlayer dielectric 216 is formed on the entire surface including the spacers 215. The third interlayer dielectric 216 gap-fills the second trench 212 between the spacers 215. A planarization process is performed to expose the first interlayer dielectric 210. The planarization process may include an etch-back process.

Figure 2H:
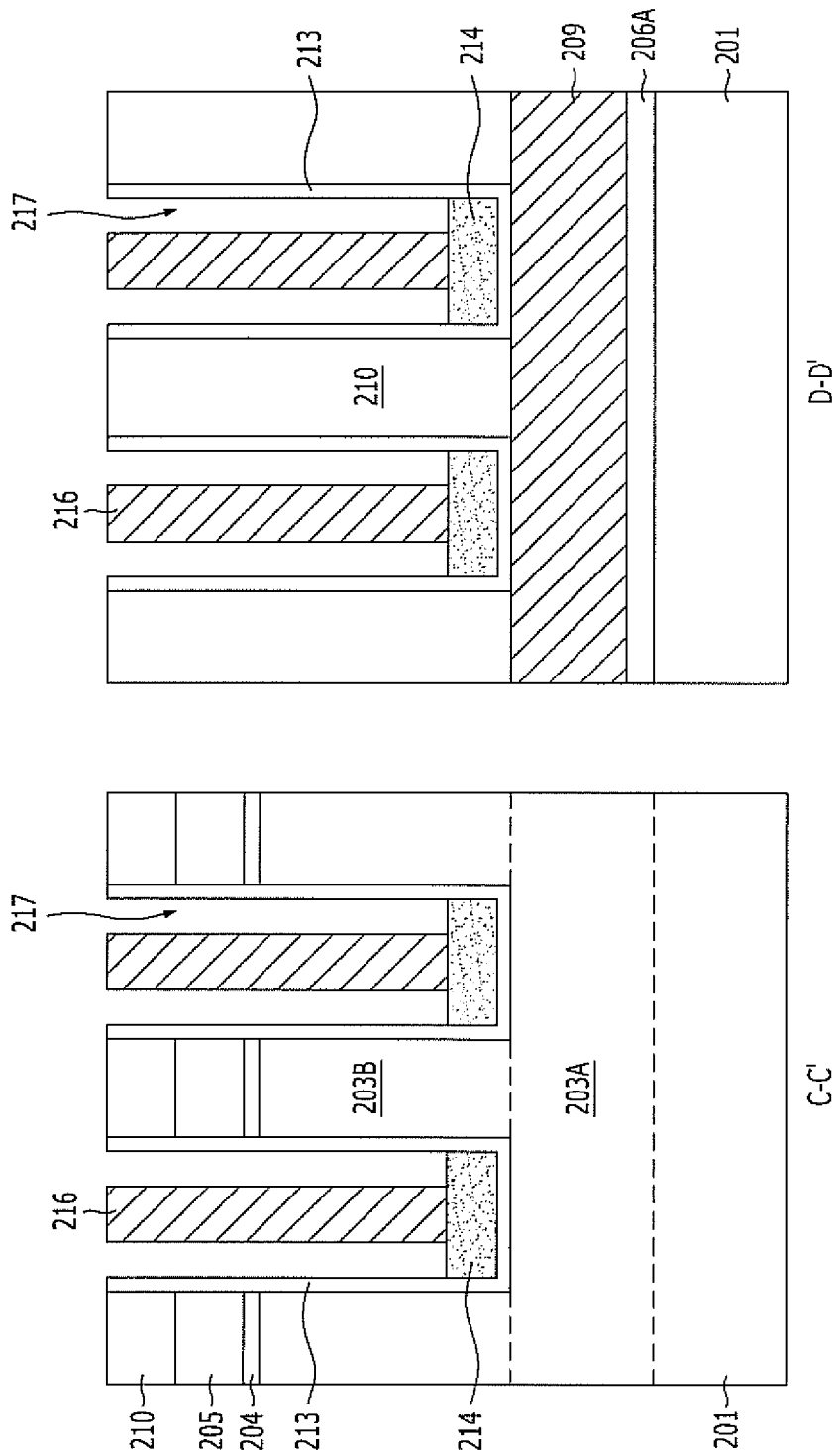

Referring to FIG. 2H, the spacers 215 are removed to form isolation trenches 217 that isolate the third interlayer dielectric 216 from sidewalls of the active pillars 203B. When the spacers 215 are a nitride layer and the isolation layer 216 and the passivation layer 214 are oxide layers, it is possible to selectively remove only the spacers 215. To this end, a wet etching process is performed using a phosphoric acid ($H_3PO_4$) solution. Such a process may also be called a wet-dip process.

Figure 2I:
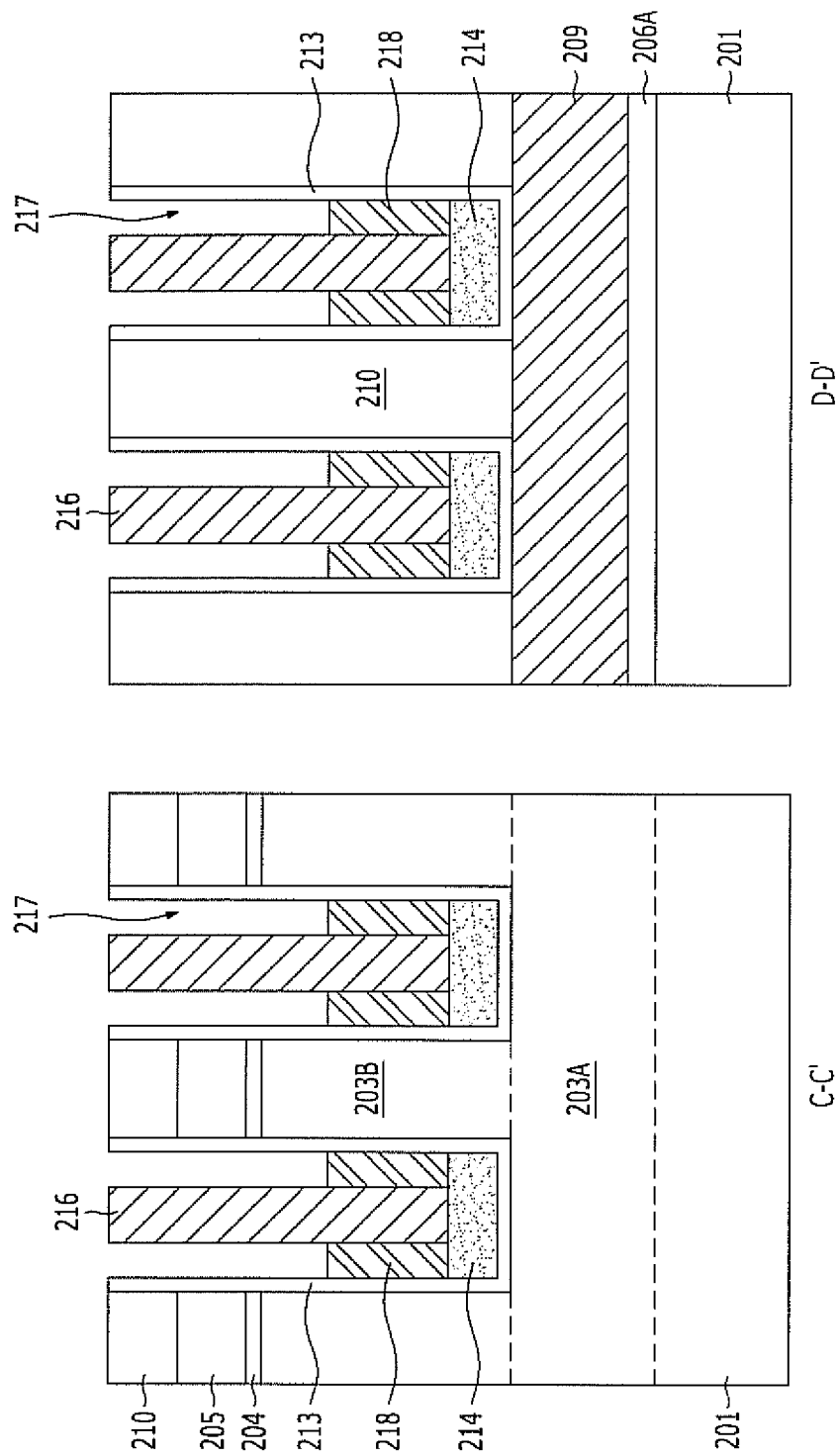

Referring to FIG. 2I, a word line conductive layer is formed to gap-fill the isolation trenches 217. The word line conductive layer is formed through an ALD process. A planarization process and an etch-back process are sequentially performed to form a buried word line 218. A wet etching process may be performed in addition to the etch-back process. The buried word line 218 may include a titanium nitride layer and a tungsten layer.

Accordingly, the buried word line 218 is formed to electrically contact the sidewall of the active pillar 203B. The buried word line 218 extends vertically along the sidewall of the active pillar 203B. The buried word line 218 also serves as a vertical gate (VG). In another exemplary embodiment, after a surround-type vertical gate is formed to surround the active pillars 203B, the buried word line 218 may be formed to connect the neighboring vertical gates. The buried word line 218 is formed across the buried bit line 209.

According to the above exemplary embodiments, an etch-back process is performed to form the buried bit line 209 (hereinafter referred to as a BBL etch-back process). Also, an etching process is performed to form the active pillar 203B (hereinafter referred to as a VG etching process). The BBL etch-back process and the VG etching process have no etch end point in terms of structure, and have a very large process variation. Therefore, the spacing distance must be controlled by considering a process variation of the two etching processes in order to prevent an electrical short between the buried bit line 209 and the buried word line 218.

After the forming of the buried bit line 209, the present invention performs the VG etching process to expose the surface of the buried bit line 209. Thereafter, the process for the passivation layer 214, the process for the isolation layer 216, and the process for the isolation trenches 217 are performed to form the buried word line 218.

Because of the passivation layer 214, the distance between the buried bit line 209 and the buried word line 218 is maintained to be constant.

FIGS. 3A to 3K are cross-sectional views illustrating a method for forming a side contact in accordance with an exemplary embodiment of the present invention.

Figure 3A:
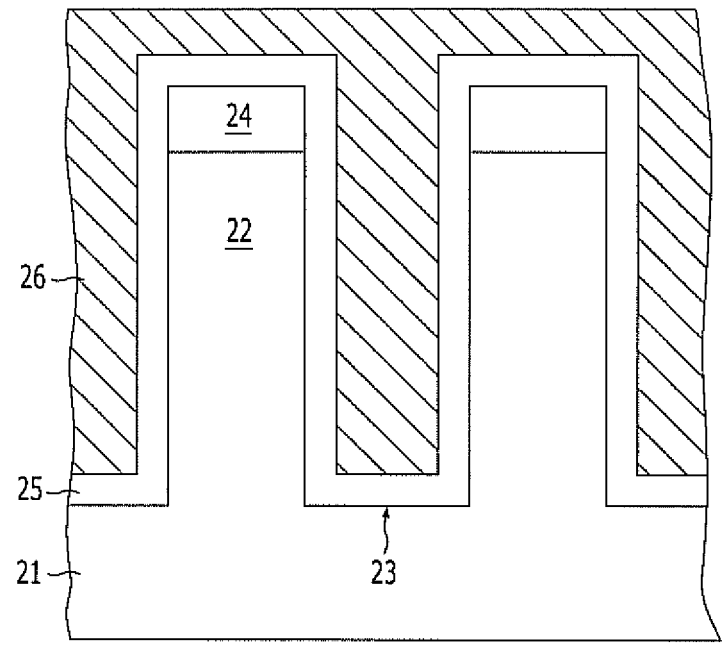
FIGS. 3A to 3K are cross-sectional views illustrating a method for forming a side contact in accordance with an exemplary embodiment of the present invention.

Referring to FIG. 3A, using a hard mask pattern 24 as an etch barrier, a substrate 21 is etched to form a body 22. The body 22 is isolated by a trench 23. A liner oxide layer 25 is formed as a dielectric layer on the entire surface of the body 22. The liner oxide layer 25 may include an oxide layer such as a silicon oxide layer.

A first gap-fill layer 26 is formed on the liner oxide layer 25 to gap-fill the trench 23. The first gap-fill layer 26 may include undoped polysilicon or amorphous silicon.

Figure 3B:
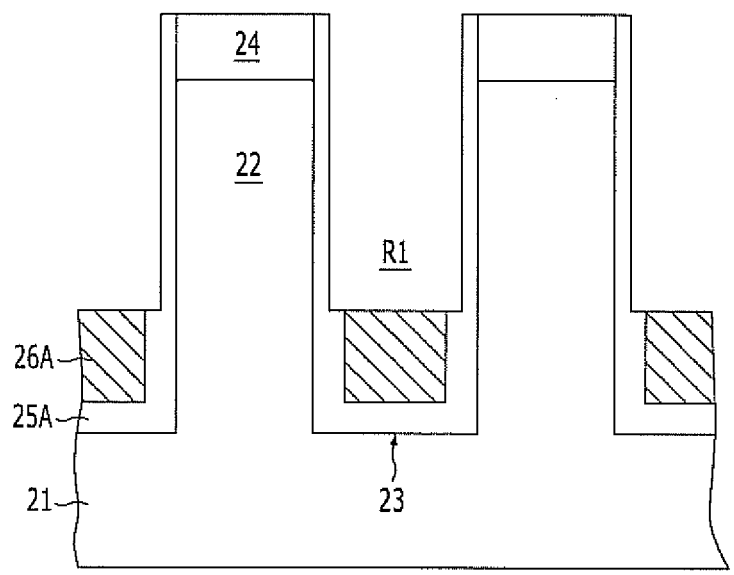

Referring to FIG. 3B, the first gap-fill layer 26 is planarized to expose the surface of the hard mask pattern 24. The planarizing of the first gap-fill layer 26 may include a Chemical Mechanical Polishing (CMP) process. Subsequently, an etch-back process is performed. After the etch-back process, a first gap-fill pattern 26A provides a first recess R1. The liner oxide layer 25 on the hard mask pattern 24 may be polished in the CMP process, thereby leaving a liner oxide pattern 25A that covers both sidewalls of the trench 23. The liner oxide pattern 25A also covers the bottom of the trench 23.

The liner oxide pattern 25A may be slimmed through a wet etching process.

Figure 3C:
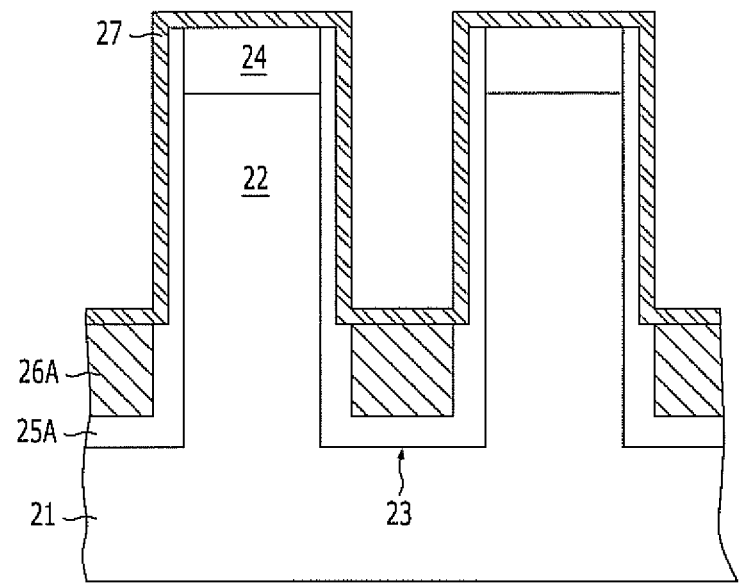

Referring to FIG. 3C, a liner nitride layer 27 is formed as a dielectric layer on the entire surface including the first gap-fill pattern 26A. The liner nitride layer 27 may include a nitride layer such as a silicon nitride layer.

Figure 3D:
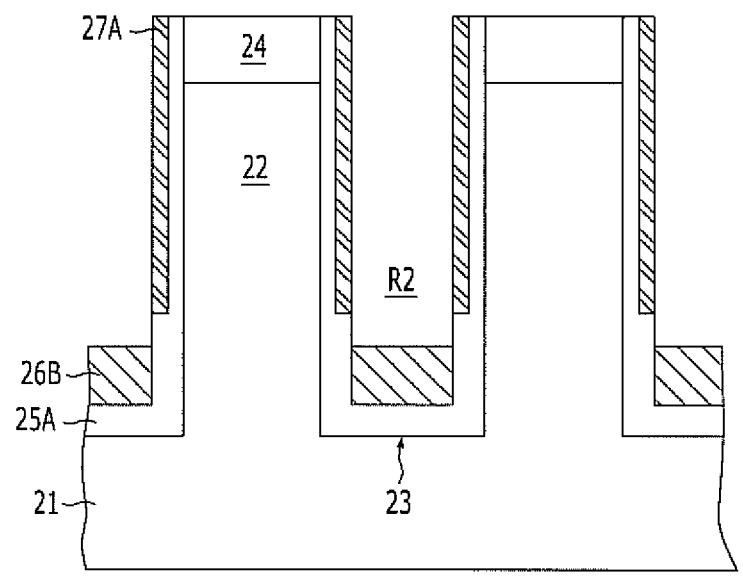

Referring to FIG. 3D, the liner nitride layer 27 is etched to form a liner nitride pattern 27A. Using the liner nitride pattern 27A as an etch barrier, the first gap-fill pattern 26A is recessed to a certain depth to form a second recess R2. The first gap-fill pattern 26A after forming the second recess R2 is denoted by reference character '26B'.

Figure 3E:
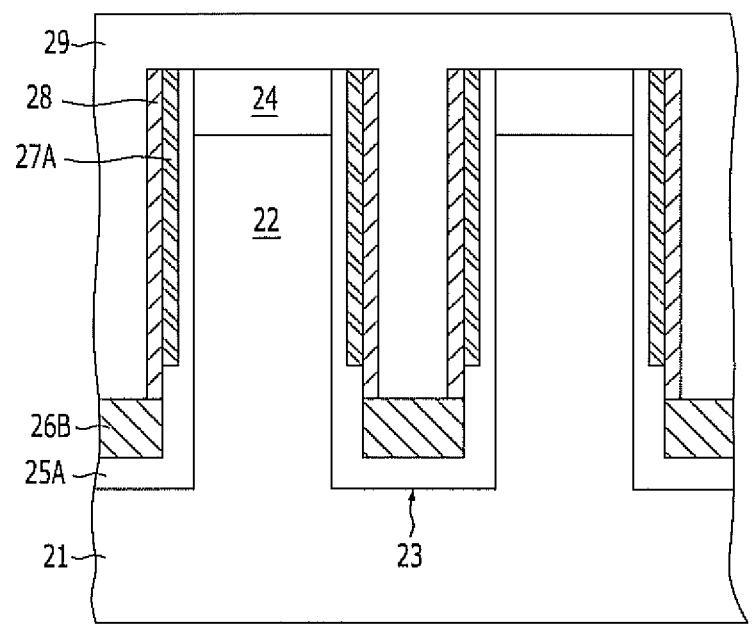

Referring to FIG. 3E, a metal oxide layer is conformally formed on the entire surface including the second recess R2. A spacer etching process is performed to form spacers 28. The spacers 28 are formed along both sidewalls of the second recess R2. The spacer 28 may include a titanium nitride (TiN) layer.

A second gap-fill layer 29 is formed to gap-fill the second recess R2 having the spacers 28 formed therein. The second gap-fill layer 29 may include an oxide layer and/or a Spin On Dielectric (SOD) layer.

Figure 3F:
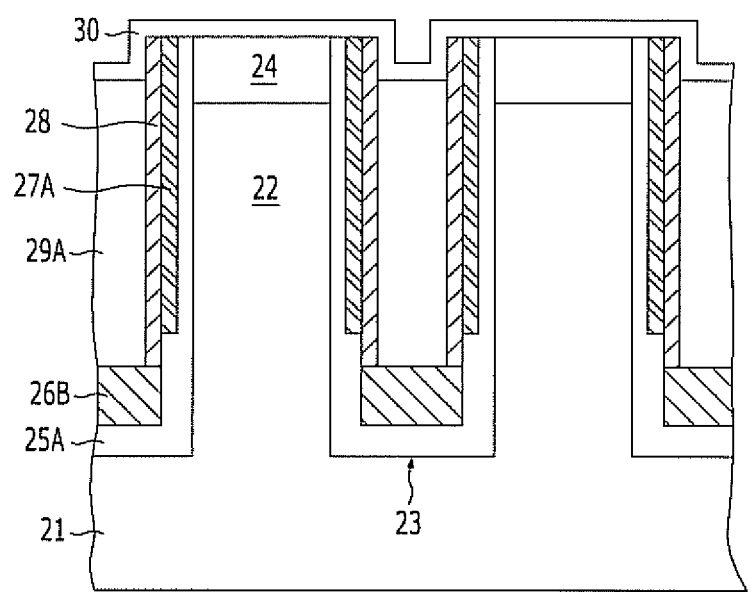

Referring to FIG. 3F, the second gap-fill layer 29 is planarized and etched back to form a recessed second gap-fill pattern 29A.

An etch barrier 30 is formed on the entire surface including the second gap-fill pattern 29A. The etch barrier 30 may include undoped polysilicon.

Figure 3G:
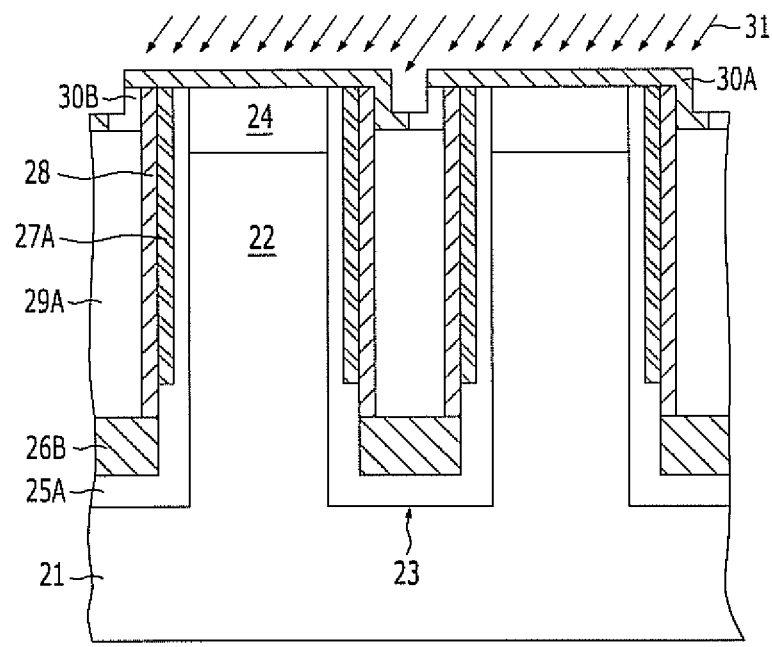

Referring to FIG. 3G, a tilt ion implantation process 31 is performed.

The tilt ion implantation process 31 ion-implants dopants at a certain tilt angle. Accordingly, dopants are implanted into a portion of the etch barrier 30.

The tilt ion implantation process 31 is performed at a predetermined angle. The predetermined angle may be in the range of approximately 5° to approximately 30°. A portion of an ion beam is shadowed by the hard mask pattern 24. Accordingly, a portion of the etch barrier 30 remains undoped, while the remainder of the etch barrier 30 is doped. The portion of the etch barrier 30 that remains undoped depends on the angle of the tilt ion implantation process 31 and the difference in height between the hard mask pattern 24 and the second gap-fill pattern 29A. For example, the ion-implanted dopants may be P-type dopants (e.g., boron), and $BF_2$ may be used as a dopant source to ion-implant the P-type dopants (e.g., boron).

As shown in FIG. 3G, because of the tilt ion implantation process 31, among the etch barrier, a portion formed on the top surface of the hard mask pattern 24 and a portion adjacent to the right of the hard mask pattern 24 become a doped etch barrier 30A implanted with dopants. Meanwhile, the etch barrier not implanted with dopants becomes an undoped etch barrier 30B.

Figure 3H:
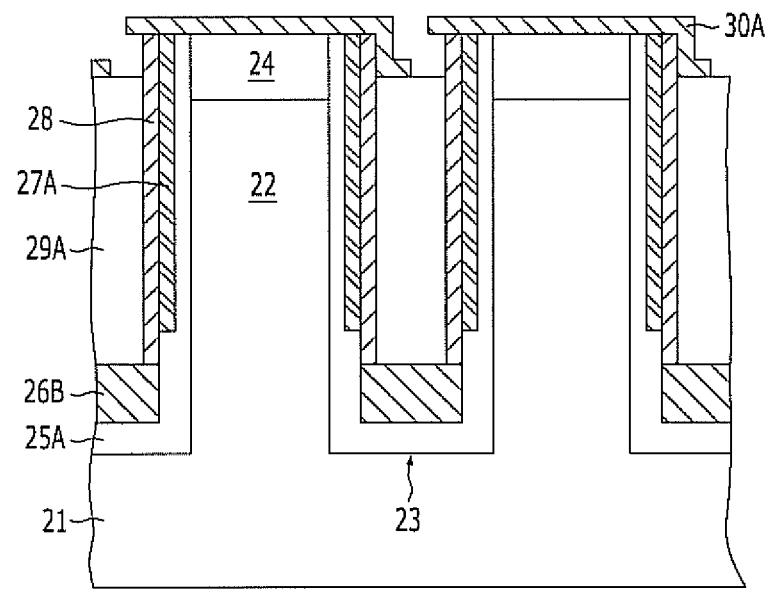

Referring to FIG. 3H, the undoped etch barrier 306 is removed. Herein, the polysilicon used as the etch barrier causes an etch rate difference according to the doping states. The undoped polysilicon not doped with dopants has a high wet-etch rate. Accordingly, a chemical with a high etch selectivity capable of wet-etching only the undoped polysilicon is used to selectively remove the undoped etch barrier (e.g., undoped polysilicon). That is, the undoped etch barrier 30B is removed through a wet etching process or a wet cleaning process.

When the undoped etch barrier 30B is removed, the doped etch barrier 30A is left.

Figure 3I:
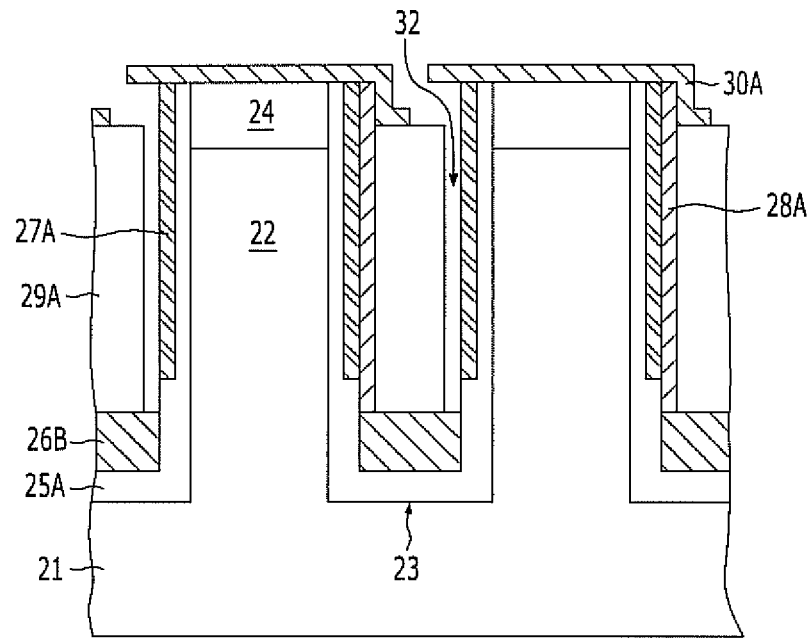

Referring to FIG. 3I, one of the spacers 38 is removed to form a gap 32. The spacer among the spacers 38 which is removed is the one that is exposed by the removal of the undoped etch barrier 30B. The exposed spacer is removed through a wet etching process, while the doped etch barrier 30A shields the other spacer. Accordingly, only one spacer 28A along one sidewall of the body 22 is left.

Figure 3J:
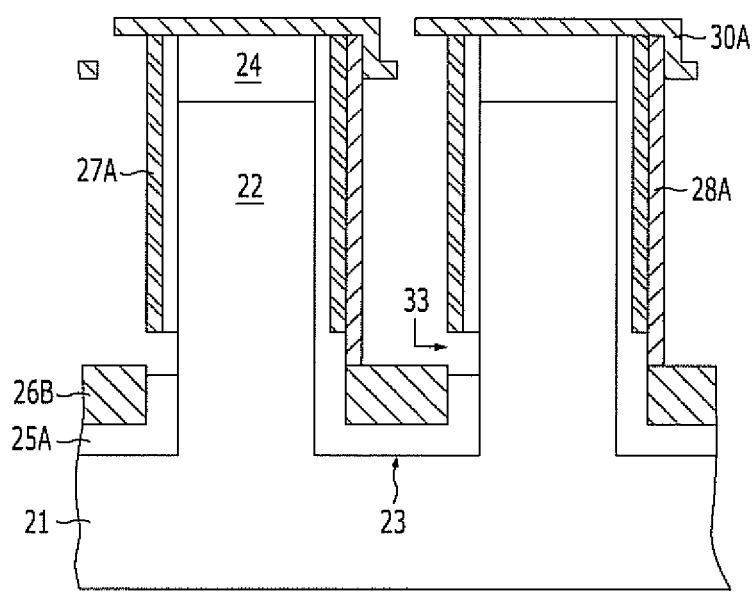

Referring to FIG. 3J, a cleaning process is performed to expose a portion of one sidewall of the body 22.

The cleaning process includes a wet cleaning process. The wet cleaning process is performed using hydrofluoric (HF) acid or BOE (Buffered Oxide Etchant). As a result of the wet cleaning process, a portion of the liner oxide pattern 25A is removed to form a one side contact 33. The second gap-fill pattern 29A is also removed in the process of forming the one side contact 33.

Thus, the one side contact 33 is provided to expose a portion of one sidewall of the body 22. Herein, as described above, the hard mask pattern 24, the liner oxide layer 25A, and the liner nitride pattern 27A may be collectively referred to as a dielectric layer.

Figure 3K:
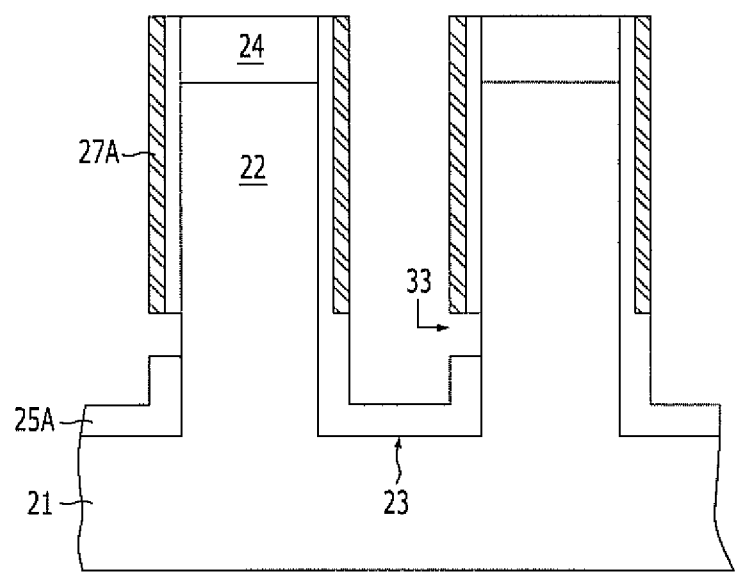

Referring to FIG. 3K, the spacer 28A and the doped etch barrier 30A are removed. The first gap-fill pattern 26B is also removed in the removing of the doped etch barrier 30A.

As described above, the present invention forms the passivation layer on the buried bit line, thereby making it possible to facilitate the insulation of the buried bit line from the buried word line.

Also, the present invention stops the VG etching process at the top surface of the buried bit line and then forms the passivation layer, thereby making it possible to maintain a constant distance between the buried bit line and the buried word line, while reducing such distance.

Also, the present invention buries the word line in the isolation trench formed by removing the spacer, thereby making it possible to form a uniform word line.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   etching a substrate to form a plurality of bodies isolated by a first trench;
   forming a buried bit line gap-filling a portion of the first trench;
   etching the top portions of the bodies to form a plurality of pillars isolated by a plurality of second trenches extending across the first trench;
   forming a passivation layer gap-filling a portion of the second trenches;
   forming an isolation layer that divides each of the second trenches into isolation trenches over the passivation layer; and
   filling a portion of the isolation trenches to form a buried word line extending in a direction crossing over the buried bit line after the forming the isolation layer.

2. The method of claim 1, wherein the forming of the pillars comprises:
   forming a dielectric layer gap-filling the first trench over the entire surface including the buried bit line; and
   forming the second trenches by etching one of the bodies and the dielectric layer to expose the surface of the buried bit line.

3. The method of claim 1, wherein the forming of the passivation layer comprises:
   forming a dielectric layer to gap-fill the second trenches; and
   etching back the dielectric layer.

4. The method of claim 3, wherein the passivation layer comprises an oxide layer.

5. The method of claim 1, wherein the forming of the isolation layer comprises:
   forming spacers along both sidewalls of the second trenches over the passivation layer;
   forming a dielectric layer gap-filling the second trenches having the spacers formed therein; and selectively removing the spacers to form the isolation trenches.

6. The method of claim 5, wherein the isolation layer comprises an oxide layer.

7. The method of claim 5, wherein the removing of the spacers is performed through a wet etching process.

8. The method of claim 1, wherein the forming of the buried word line comprises:
   forming a conductive layer to gap-fill the isolation trenches; and
   recessing the conductive layer.

9. The method of claim 8, wherein the recessing of the conductive layer is performed through an etch-back process or a wet etching process.

10. The method of claim 8, wherein the conductive layer comprises a titanium nitride layer.

11. The method of claim 1, wherein the buried bit line is electrically connected to one of the plurality of bodies through a one side contact.

12. A method for fabricating a semiconductor device, comprising:
   etching a substrate comprising a buried bit line to form a plurality of pillars isolated by a trench;
   forming a passivation layer gap-filling a portion of the trench;
   forming spacers covering both sidewalls of the trench over the passivation layer;
   forming an isolation layer gap-tilling the trench between the spacers;
   selectively removing the spacers to form isolation trenches; and
   forming a buried word line filling the isolation trenches after the forming the isolation layer.

13. The method of claim 12, wherein the forming of the passivation layer comprises:
   forming a dielectric layer to gap-fill the trench; and
   etching back the dielectric layer.

14. The method of claim 12, wherein the passivation layer comprises an oxide layer.

15. The method of claim 12, wherein the isolation layer comprises an oxide layer.

16. The method of claim 12, wherein the removing of the spacers is performed through a wet etching process.

17. The method of claim 12, wherein the forming of the buried word line comprises:
   forming a conductive layer to gap-fill the isolation trenches; and
   recessing the conductive layer.

18. The method of claim 17, wherein the recessing of the conductive layer is performed through an etch-back process or a wet etching process.

19. The method of claim 17, wherein the conductive layer comprises a titanium nitride layer.

* * * * *